(12) United States Patent
Kailer et al.

(10) Patent No.: US 10,320,019 B2
(45) Date of Patent: Jun. 11, 2019

(54) PROCESS FOR PRODUCING A SOLID OXIDE FUEL CELL BY DEPOSITING AN ELECTRICALLY CONDUCTIVE AND GAS PERMEABLE LAYER ON A POROUS SUPPORT SUBSTRATE

(71) Applicant: PLANSEE SE, Reutte (AT)

(72) Inventors: Karl Kailer, Breitenwang (AT); Georg Kunschert, Vienna (AT); Stefan Schlichtherle, Ehrwald (AT); Georg Strauss, Muenster (AT)

(73) Assignee: Plansee SE, Reutte (AT)

( * ) Notice: Subject to any disclaimer, the term of this patent is extended or adjusted under 35 U.S.C. 154(b) by 429 days.

(21) Appl. No.: 14/618,127

(22) Filed: Feb. 10, 2015

(65) Prior Publication Data

US 2015/0155581 A1 Jun. 4, 2015

Related U.S. Application Data

(63) Continuation of application No. 12/349,735, filed on Jan. 7, 2009, now abandoned, which is a continuation
(Continued)

(30) Foreign Application Priority Data

Jul. 7, 2006 (AT) .................................. GM534/2006

(51) Int. Cl.
 *C23C 14/34* (2006.01)
 *H01M 8/10* (2016.01)
 (Continued)

(52) U.S. Cl.
 CPC ........... *H01M 8/10* (2013.01); *C23C 14/0688* (2013.01); *C23C 14/08* (2013.01); *C23C 14/088* (2013.01);
(Continued)

(58) Field of Classification Search
 CPC ... C23C 14/0688; C23C 14/088; C23C 14/08; C23C 14/3485
 See application file for complete search history.

(56) References Cited

U.S. PATENT DOCUMENTS 2,826,805 A 3/1958 Probst et al.
3,525,646 A * 8/1970 Tannenberger ......... H01M 8/12
429/454
(Continued)

FOREIGN PATENT DOCUMENTS

CN 1564266 A 1/2005
DE 4119498 A1 12/1992
(Continued)

OTHER PUBLICATIONS

Kang et al, "Thin-Film Solid Oxide Fuel Cells on Porous Nickel Substrates with Multistage Nanohole Array", Journal of The Electrochemical Society, vol. 153, Issue 3, 2006, pp. A-554-A559, XP007917564.
(Continued)

*Primary Examiner* — Jason Berman
(74) *Attorney, Agent, or Firm* — Laurence A. Greenberg; Werner H. Stemer; Ralph E. Locher

(57) ABSTRACT

A process for depositing an electrically conductive, preferably perovskitic layer uses a pulsed sputtering process. The layer has a low diffusivity for the elements in the iron group and is especially suitable for use in solid oxide fuel cells (SOFC). An assembly of the electrically conductive ceramic layer on a porous support substrate is also provided.

17 Claims, 1 Drawing Sheet

Related U.S. Application Data of application No. PCT/AT2007/000338, filed on Jul. 5, 2007.

(51) Int. Cl.
  *C23C 14/08* (2006.01)
  *C23C 14/06* (2006.01)
  *H01M 4/90* (2006.01)

(52) U.S. Cl.
  CPC .......... *C23C 14/34* (2013.01); *C23C 14/3485* (2013.01); *H01M 4/9033* (2013.01); *Y10T 428/24997* (2015.04); *Y10T 428/265* (2015.01)

(56) References Cited

U.S. PATENT DOCUMENTS

| | | | |
|---|---|---|---|
| 3,980,444 | A | 9/1976 | Reen |
| 4,028,094 | A | 6/1977 | Reen et al. |
| 5,134,042 | A * | 7/1992 | Madou ................. B01J 23/002 204/426 |
| 5,162,294 | A | 11/1992 | Talvacchio et al. |
| 5,304,293 | A | 4/1994 | Tierney et al. |
| 5,686,198 | A * | 11/1997 | Kuo ...................... C04B 35/016 264/618 |
| 6,004,696 | A | 12/1999 | Barnett et al. |
| 6,176,986 | B1 * | 1/2001 | Watanabe ............. C04B 35/465 204/298.13 |
| 6,455,326 | B1 * | 9/2002 | Eastep ................. C23C 14/088 257/295 |
| 2003/0161969 | A1 | 8/2003 | Hilliard |
| 2004/0259305 | A1 | 12/2004 | Demaray et al. |
| 2005/0092597 | A1 | 5/2005 | O'Neil et al. |
| 2005/0265885 | A1 | 12/2005 | Schuisky et al. |
| 2005/0266297 | A1 | 12/2005 | Irvine et al. |
| 2006/0260466 | A1 | 11/2006 | Tanaka et al. |

FOREIGN PATENT DOCUMENTS

| | | |
|---|---|---|
| DE | 19804838 A1 | 8/1999 |
| EP | 1600520 A1 | 11/2005 |
| JP | 2004155600 A | 6/2004 |
| JP | 2004199894 A | 7/2004 |

OTHER PUBLICATIONS

Li et al., Solid-State Chemistry of Inorganic Materials V (Materials Research Society Symposium Proceedings vol. 848), Nov. 29-Dec. 2, 2004, Boston, MA.

Johnson et al., "Perovskite based protective coatings for solid oxide fuel cell metallic interconnects", Electromechanical Society Proceedings vol. 2005-07, pp. 1842-1850.

Ruske et al., "Hydrogen doping of DC sputter ZnO:Al films from novel target material", Surface and Coatings Technology, 2005, pp. 236-240, vol. 200, Issues 1-4, Elsevier/Science Direct.

Cortarolo et al., "Structural evolution of $La_{0.9}Sr_{0.1}Cr_{0.9}Co_{0.1}O_3$ thin films for SOFCs and catalysis", Material Research Society Symposium Proceedings, 2006, URL: http://research.cecs.ucf.edu/chea/pdf/MRS-Anthony-published-Fall-2005.pdf.

Teraoka et al., "Development of Oxygen Semipermeable Membrane Using Mixed Conductive Peroskite-Type Oxides (Part 2)—Preparation of Dense Film of Perovskite-Type Oxide on Porous Substrate", J.Ceram.Soc.Jpn.Ed. vol. 97, 1989, pp. 523-529.

Luo et al., "RF-Magnetron Sputtered Conductive Perovskite $BaPbO_3$ Films", Jpn. J. Appl. Phys. Part 1, vol. 42 2003, pp. 242-246.

Tomsic, Joan L., "Dictionary of Materials and Testing" 2nd. Ed., 2000, p. 284.

* cited by examiner

PROCESS FOR PRODUCING A SOLID OXIDE FUEL CELL BY DEPOSITING AN ELECTRICALLY CONDUCTIVE AND GAS PERMEABLE LAYER ON A POROUS SUPPORT SUBSTRATE

CROSS-REFERENCE TO RELATED APPLICATION

This application is a continuation, under 35 U.S.C. § 120, of copending patent application Ser. No. 12/349,735, filed Jan. 7, 2009, which was a continuation of International Application No. PCT/AT2007/000338, filed Jul. 5, 2007, which designated the United States; this application also claims the priority, under 35 U.S.C. § 119, of Austrian Patent Application GM 534/2006, filed Jul. 7, 2006; the prior applications are herewith incorporated by reference in their entirety.

BACKGROUND OF THE INVENTION

Field of the Invention

The invention relates to a process for producing or depositing an electrically conductive layer with a perovskitic structure. The invention also relates to an assembly of the layer on a porous support substrate.

Protective layers with a perovskitic structure are used, for example, in high-temperature fuel cells (SOFC: Solid Oxide Fuel Cell). They are operated at temperatures of approximately 650 to 900° C., since it is only at those temperatures that the thermodynamic conditions for efficient energy production prevail. In the case of planar SOFC systems, individual electrochemical cells made up of a cathode, a solid electrolyte and an anode are stacked to form a stack and connected through the use of metallic components, so-called interconnectors.

The interconnector also separates anode and cathode gas spaces. A dense interconnector is just as important as a dense electrolyte layer for ensuring a highly effective high-temperature fuel cell. Suitable materials for interconnectors also have to have a sufficient conductivity and resistance to the oxidizing conditions on the air side and reducing conditions on the fuel gas side. Those requirements are currently best met by lanthanum chromite, chromium/iron alloys which are doped with yttrium oxide, and chromium-rich ferrites.

In order to reduce the evaporation of chromium during use, a conductive layer with a perovskitic structure is deposited on the interconnector.

Depending on the nature and extent of doping, perovskites, which are currently used for producing cathodes in SOFCs, have the property of being mixed conductors, i.e. they conduct both electrons and ions. Perovskites are thermodynamically stable even at high oxygen partial pressures and, in order to improve the contact-connection, are also applied to that side of the interconnector which faces towards the cathode.

In addition to simply coating the surfaces with contact pastes including perovskitic ceramic, processes such as APS (Atmospheric Plasma Spraying), VPS (Vacuum Plasma Spraying), dip coating or wet powder spraying have been evaluated, or are used on a semi-industrial scale, for coating interconnectors. Those spraying processes are also used to produce electrochemically active cell layers in the high-temperature fuel cell. VPS and APS are spraying processes which are carried out either under vacuum or under atmospheric conditions. In those processes, powder is melted in a plasma jet, and the powder grains immediately solidify in flat form with a thickness of a few μm when they impact on the substrate surface. A certain degree of residual porosity cannot be prevented in that technique. In order to achieve gas-tight structures as far as possible, thick layers with layer thicknesses of approximately 30 to 50 μm are deposited. Large quantities of ceramic material are therefore applied to the substrate surfaces, and that leads to correspondingly high costs. In addition, the electron transmission is reduced in the case of thick layers. The ever-present porosity also reduces the electron conductivity.

CVD processes on the basis of chloridic compounds and reaction with water vapor at deposition temperatures of 1100 to 1300° C. have also been tested. Layers with thicknesses of 20 to 50 μm have been produced using that process. That process, too, is costly and the high deposition temperatures are also disadvantageous.

In order to deal more effectively with the problems which have occurred in the past during contact-connection of the interconnectors, new planar SOFC concepts have also been developed. Most recently, those include the so-called MSC (Metal Supported Cell) concept, in which electrochemical cells are applied directly to porous support substrates. Those porous metallic support substrates can be used both on the cathode side and on the anode side.

MSC concepts on the anode side permit high power densities to be achieved and constitute an inexpensive alternative.

Anodes which are formed of NiO—YSZ (nickel oxide-yttrium stabilized zirconium oxide) and are in direct material contact with the porous metallic support substrate, are used for the MSC concept. Since those support substrates are conventionally formed of an Fe-based alloy with a high Cr content, Ni diffuses from the anode into the support substrate or Fe and Cr diffuse from the support substrate into the NiO—YSZ anode when used at temperatures of 650 to 900° C. The result of that interdiffusion phenomenon is that a diffusion zone of Fe—Cr—Ni is formed in the contact area. In comparison with the support substrate, that diffusion zone has a considerably higher coefficient of thermal expansion. That can lead to spalling which would result in severe degradation or total failure. The interdiffusion can be prevented by perovskitic diffusion barrier layers. To date, that has been done by depositing porous layers, since otherwise the support substrate is no longer gas-permeable. Plasma-sprayed diffusion barrier layers are also applied to the cathode side of interconnectors. It is disadvantageous in that case that very thick and therefore expensive layers are used due to the intrinsically high porosity.

SUMMARY OF THE INVENTION

It is accordingly an object of the invention to provide a process for depositing or producing an electrically conductive layer and an assembly of the layer on a porous support substrate, which overcome the hereinafore-mentioned disadvantages of the heretofore-known processes and assemblies of this general type and which initially permit an inexpensive production of thin, dense and electrically conductive ceramic layers.

A further object of the invention is to provide a conductive ceramic diffusion barrier layer applied to a porous support substrate, which does not considerably impair the gas permeability of the support substrate.

With the foregoing and other objects in view there is provided, in accordance with the invention, a process for depositing or producing an electrically conductive ceramic layer. The process comprises producing the layer by a pulsed sputtering process.

In this case, an electrically conductive ceramic layer, preferably with a perovskitic structure, is deposited through the use of a pulsed sputtering process. The process according to the invention makes it possible to uniformly apply thin, dense and functional ceramic layers to the surface of dense, but also porous, substrate materials. The mass transfer through the applied layer is restricted to defect mechanisms. Even at temperatures above 600° C., the diffusivity of, for example, chromium in the layer according to the invention is very low. This makes it possible to use very thin layers with a thickness of preferably 0.1 to 5 µm as the diffusion barrier layer. The barrier effect is insufficient at a thickness of below 0.1 µm. The layer tends to spall at a thickness of above 5 µm.

The use of thin layers increases the electron transmission of the metallic interconnector/layer system.

If the layer according to the invention is applied to a porous support substrate, a closed top layer is not formed. The predominantly open-pored structure of the support substrate is therefore retained. As a result, the coated support substrate has good transport and contact-connection properties. The porous support substrate preferably has a density of 40 to 70% of the theoretical density and preferably is formed of sintered grains of an Fe-based alloy including 15 to 35% by weight of Cr, 0.01 to 2% by weight of one or more elements selected from the group consisting of Ti, Zr, Hf, Mn, Y, Sc, rare earths, 0 to 10% by weight of Mo and/or Al, 0 to 5% by weight of one or more metals selected from the group consisting of Ni, W, Nb, Ta and 0.1 to 1% by weight of O, a remainder of Fe and impurities.

PVD processes are not used for coating interconnectors with ceramic materials since, to date, it has been assumed that the difficult process management of reactive PVD processes makes them unsuitable for depositing conductive ceramic layers, in particular dielectric layers with a perovskitic structure, since it is not possible to achieve a stoichiometric deposition of the complex layer material and the required layer properties, such as high density and good electrical conductivity.

In the case of sputtering, the layer is made up of electrically neutral particles which have different energies due to the process. The coating material is therefore opposite the substrate as a target. During sputtering, the target is bombarded with positive ions. A voltage is applied between the substrate (holder) and the target, and therefore positive ions are accelerated towards the target where they eject atoms or molecules which then settle on the substrate as neutral particles, uninfluenced by the outer field, and form the thin functional layer. In order to produce the positive ions required for the sputtering process, use is made of the independent glow discharge principle. The space between the anode and the cathode is evacuated and then filled with the process gas. A voltage is applied between the anode and the cathode. This results in the formation of substantially three regions: a cathode dark space, a quasi-neutral transition zone and a positive column. The procedures between the cathode and the anode can therefore be summarized into the following processes: electron bombardment ionization of gas atoms, ion-induced electron emission at the cathode, electron-induced secondary emission at the anode and ion bombardment sputtering.

The use of pulsed sputtering plasmas makes it possible to use significantly higher target currents and arc currents. The higher current intensities mean that considerably higher coating rates can be achieved.

The use of oxide-ceramic sputtering targets makes it possible to carry out the process in non-reactive fashion, and this achieves high process stability and reduces the technical complexity. The content of multiply charged particles and the kinetic energy of the particles can be increased due to the relatively high degree of plasma excitation, and this makes it possible to provide a coating without a substrate bias. This results in improved layer properties such as, for example, a higher layer density, improved adhesion, higher electrical conductivity and improved chemical resistance.

The concentration of the elements in the sputtering target differs at most by 5% from the concentration of the respective element in the layer. The process according to the invention therefore permits ceramic, preferably perovskitic layers to be stoichiometrically deposited, even on unheated substrates. The layer surfaces produced are smooth and chemically stable.

In this case, the layer is deposited at a frequency of the pulsed voltage of 1 to 1000 kHz. At below 1 kHz or during DC operation, no stable coating processes can be carried out in the case of the deposition of dielectric materials. Instead, electrical flashovers and arcing occur.

At above 1000 kHz, the technical outlay for the voltage supply and the number of adapting units required for controlling the process impedance become too great for an economic coating. The process becomes particularly economical when a frequency of 10 to 500 kHz, preferably 100 to 350 kHz, is chosen. In this case, the voltage root-mean-square value is +100 to −1000 V, preferably +100 to −500 V. The voltage root-mean-square value of an AC voltage is understood to mean the DC voltage value which corresponds to the same heat effect. The ratio of peak amplitude to root-mean-square value is referred to as the crest factor and is, for example, 1.41 for sinusoidals. At values below the stated limit value, the particle energies are too low for the desired sputtering process. At values above the stated limit value, the high particle energies can result in undesirable effects such as, for example, sputtering away of the evaporating layer, electrical flashovers due to high field strengths, implantation in the substrate, undesirable increase in temperature, etc., which prevent layers with a perovskitic structure from being deposited.

It has proven to be advantageous to deposit the layer with a mean power density of 1 to 30 W/cm$^2$. At below 1 W/cm$^2$, the coating rate is too slow and the coating duration is therefore too long for industrial implementation. At above 30 W/cm$^2$, the input of energy at the target is too great, and this results in the thermal destruction of the perovskitic target material.

The process gas used is an inert gas, preferably argon, with a pressure of $1 \times 10^{-4}$ to $9 \times 10^{-2}$ mbar. At below $1 \times 10^{-4}$ mbar, the sputtering process cannot be ignited. At above $9 \times 10^{-2}$ mbar, the free path lengths of the sputtered layer particles become too small as a result of too many impact processes. This reduces the kinetic energy of the sputtered layer particles, which means that the desirable layer properties cannot be achieved.

The ceramic layer preferably has a perovskitic structure with the structural formula $ABO_3$. The crystal structure in this case is cubic, orthorhombic or tetragonal. A includes one or more elements selected from the group consisting of La, Ba, Sr, Ca. B includes one or more elements selected from the group consisting of Cr, Mg, Al, Mn, Fe, Co, Ni, Cu and Zn. The layers preferably have a density>99% of the theoretical density and an impurity content<0.5% by weight, preferably <0.1% by weight.

Other features which are considered as characteristic for the invention are set forth in the appended claims.

Although the invention is illustrated and described herein as embodied in a process for depositing an electrically conductive layer and an assembly of the layer on a porous support substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Reference will now be made in detail to the figures of the drawings, with which examples are described.

Example 1

A porous support substrate having a composition of 26% by weight Cr, 0.5% by weight $Y_2O_3$, 2% by weight Mo, 0.3% by weight Ti and 0.03% by weight Al and a remainder of Fe was coated through the use of a pulsed, non-reactive DC process. This was done using an Edwards sputter coater fitted with an LSM target ($La_{0.8}Sr_{0.2}Mn$ oxide) with a diameter of 72 mm. A sputtering power of 400 W, a voltage of 149 V, a current of 2.01 A, a frequency of 350 kHz (with a pulse duration of 1.1 μs) and a process pressure of $5*10^{-3}$ mbar were also set. This produced LSM layers being 3 μm thick and having the composition $La_{0.8}Sr_{0.2}Mn$ oxide (LSM).

Figure 1:
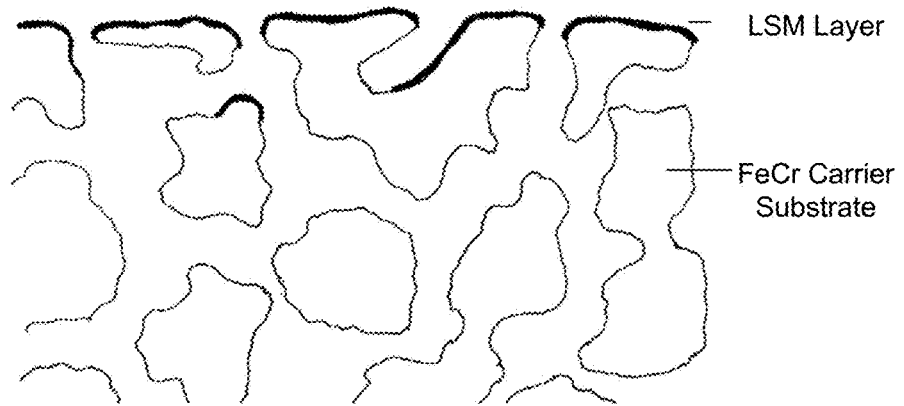
FIG. 1 is an illustration diagrammatically showing a configuration of a perovskitic layer on a porous substrate.

FIG. 1 diagrammatically shows the configuration of the deposited layers on the porous support substrate.

Example 2

Porous and dense support substrates having a composition of 26% by weight Cr, 0.5% by weight $Y_2O_3$, 2% by weight Mo, 0.3% by weight Ti and 0.03% by weight Al and a remainder of Fe were coated through the use of a pulsed, non-reactive DC process. This was done using an Edwards sputter coater fitted with an LSC target ($La_{0.8}Sr_{0.2}Cr$ oxide) with a diameter of 72 mm. A sputtering power of 400 W, a voltage of 149 V, a current of 2.01 A, a frequency of 350 kHz (with a pulse duration of 1.1 μs) and a process pressure of $5*10^{-3}$ mbar were also set. This produced LSC layers being 3 μm thick and having the composition $La_{0.8}Sr_{0.2}CrO_3$.

Figure 2:
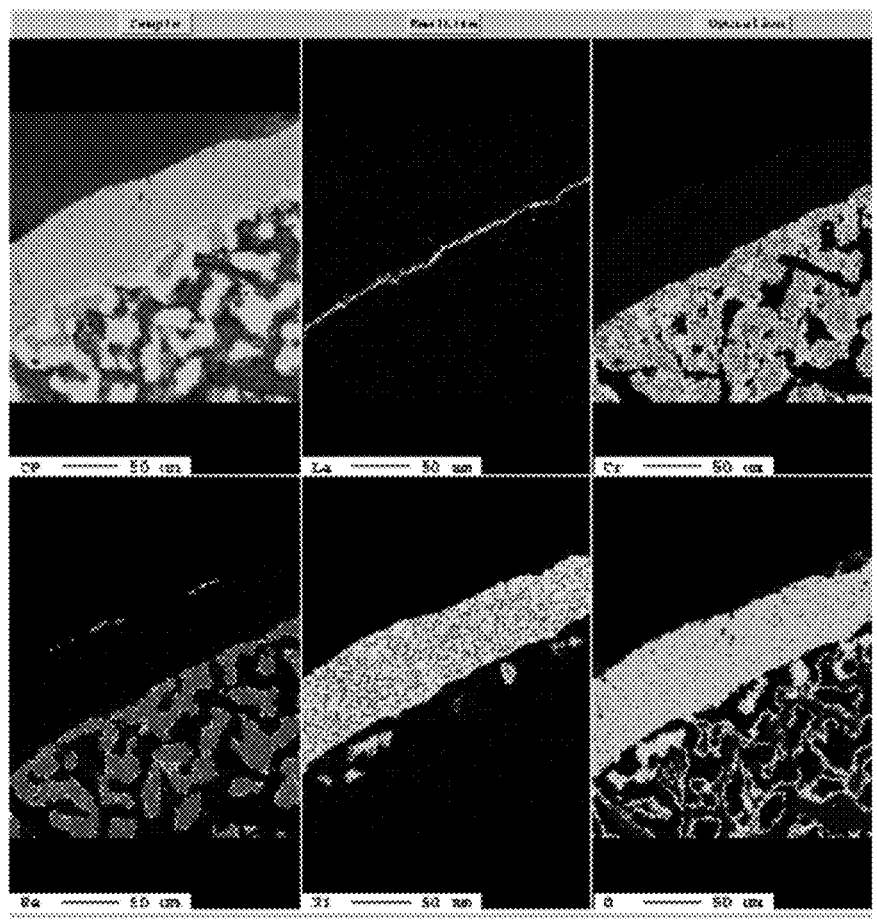
FIG. 2 is a group of photographs showing EPMA measurements of a porous substrate with an LSC layer and an Ni layer deposited thereon, after ageing for 1000 h at 850° C.

The LSC layers were then coated with an APS nickel layer being 50 μm thick. This structure of an iron/chromium alloy (porous and non-porous)—LSC layer (3 μm)—APS nickel layer (50 μm) was used to investigate the diffusion barrier effect of the thin LSC layer with respect to nickel into iron or iron into nickel. In this case, the structure was aged in air for 100 h at 850° C. to 1000° C. The diffusion properties were documented using EPMA measurements, as seen in FIG. 2. The LSC layer prevents diffusion of nickel into iron or iron into nickel under the stated test conditions. The LSC layers deposited have a high electrical conductivity (corresponding to the target used), a high density>99.9%, a homogeneous layer structure and a smooth surface with a mean roughness value which is the same as the mean roughness value of the substrate. As a result of the process, no foreign atom inclusions can be measured through the use of EPMA and EDX.

The invention claimed is:

1. A process for producing a metal-supported solid oxide fuel cell, the process comprising the following steps:
   providing a porous metallic support substrate formed of sintered grains of a Fe-based alloy, the support substrate having an open-pore structure, being gas permeable and having a density of 40% to 70% of a theoretical density;
   depositing an electrically conductive ceramic diffusion barrier layer directly on the metallic porous support substrate by a pulsed sputtering process retaining the open-pore structure of the substrate and a gas permeability thereof, forming a coated porous metallic support substrate that is gas permeable; and
   applying an anode in direct material contact with the coated porous support substrate to produce a support structure with an anode of the metal-supported solid oxide fuel cell.

2. The process according to claim 1, wherein the ceramic layer has a perovskitic structure.

3. The process according to claim 1, which further comprises using an oxide-ceramic sputtering target in the pulsed sputtering process.

4. The process according to claim 1, which further comprises using a sputtering target in the pulsed sputtering process, wherein a concentration of elements in the sputtering target differs at most by 5% from a concentration of respective elements in the layer.

5. The process according to claim 1, which further comprises depositing the layer at a frequency of a pulsed voltage of 1 to 1000 kHz.

6. The process according to claim 5, which further comprises depositing the layer at a frequency of the pulsed voltage of 100 to 350 kHz.

7. The process according to claim 1, which further comprises depositing the layer with a voltage root-mean-square value of +100 to −1000 V.

8. The process according to claim 7, which further comprises depositing the layer with a voltage root-mean-square value of +100 to −500 V.

9. The process according to claim 1, which further comprises depositing the layer with a mean power density of 1 to 30 $W/cm^2$.

10. The process according to claim 1, which further comprises using an inert gas as a process gas with a pressure of $1\times10^{-4}$ to $9\times10^{-2}$ mbar.

11. The process according to claim 10, which further comprises using argon as the process gas.

12. The process according to claim 1, wherein the layer has a structural formula $ABO_3$, where A includes one or more elements selected from the group consisting of La, Ba, Sr and Ca; and B includes one or more elements selected from the group consisting of Cr, Mg, Al, Mn, Fe, Co, Ni, Cu and Zn.

13. The process according to claim 1, which further comprises depositing the layer with a thickness of 0.1 to 5 µm.

14. The process according to claim 1, which further comprises depositing the layer with a density>99% of a theoretical density.

15. The process according to claim 1, which further comprises depositing the layer with an impurity content<0.5% by weight.

16. The process according to claim 15, wherein the impurity content is <0.1% by weight.

17. The process according to claim 1, wherein the porous substrate is gas permeable and the porous substrate with the conductive ceramic layer is gas permeable.

\* \* \* \* \*